United States Patent [19]

Nippert

[11] 4,049,185
[45] Sept. 20, 1977

[54] METHOD OF FORMING DOUBLE EXTRUDED MOUNT

[75] Inventor: Russell A. Nippert, Delaware, Ohio

[73] Assignee: The Nippert Company, Delaware, Ohio

[21] Appl. No.: 776,709

[22] Filed: Mar. 11, 1977

[51] Int. Cl.² .................... B23K 31/00; H01L 21/48
[52] U.S. Cl. ................................. 228/155; 29/591; 29/DIG. 47; 174/52 H; 357/81
[58] Field of Search ............... 29/630 R, 592, 626, 29/DIG. 47, 589, 590, 591, 580, 576 C, 576 R, 581; 228/155, 170; 357/81; 174/52 H

[56] References Cited

U.S. PATENT DOCUMENTS

| 3,005,867 | 10/1961 | Green ............................ 174/52 H |
| 3,015,760 | 1/1962 | Weil ............................. 174/52 H |
| 3,197,843 | 8/1965 | Nippert ......................... 228 155 X/ |
| 3,197,857 | 8/1965 | Nippert ............................ 228/155 |
| 3,199,000 | 8/1965 | Nippert ......................... 174/52 H |
| 3,279,039 | 10/1966 | Nippert .............................. 29/591 |
| 3,408,451 | 10/1968 | Redwanz ....................... 174/52 H |

Primary Examiner—Victor A. DiPalma

[57] ABSTRACT

A process for the formation of a mount for a semi-conductor, such as a rectifier or the like, in which a steel ring and a steel tube are brazed in position on the upper surface of a previously formed hexagonal copper billet, following which the parts are cold-formed in a plurality of extrusion steps for producing an accurately formed mount in which the copper material is work-hardened.

3 Claims, 6 Drawing Figures

METHOD OF FORMING DOUBLE EXTRUDED MOUNT

BACKGROUND OF THE INVENTION

A number of procedures have been provided for forming semi-conductor mounts including U.S. Pat. Nos. 2,934,813 of May 3, 1960, 3,197,843 of Aug. 3, 1965, 3,197,857 of Aug. 3, 1965, 3,199,000 of Aug. 3, 1965, 3,279,039 of Oct. 18, 1966, and 3,918,625 of Nov. 11, 1975, all issued to the same assignee as this application.

SUMMARY OF THE INVENTION

The present invention provides a method of forming a mount of the same general type as disclosed in the above noted patents in which the copper billet, preferably a copper zirconium alloy as described in said patents, is pre-formed to produce a generally hexagonal shape, after which a steel ring and a steel tube are secured in predetermined position by means of a brazing operation, after which the mount is subjected to a plurality of cold-working operations resulting in a first and second extrusion of the copper metal to form a central recess inwardly of the shaped ring and tube on which the semi-conductor is received, together with a downwardly projecting mounting stem, the cold-forming resulting in work-hardening of the material of the mount. The initial formation of the billet produces either a recess or a pedestal on the upper surface of the mount which is used to accurately locate the steel tube, in the case of the recess in relation to the outside diameter of the tube or in the case of the pedestal to locate the tube in relation to its inside diameter.

DESCRIPTION OF THE PREFERRED EMBODIMENT

Figure 1:
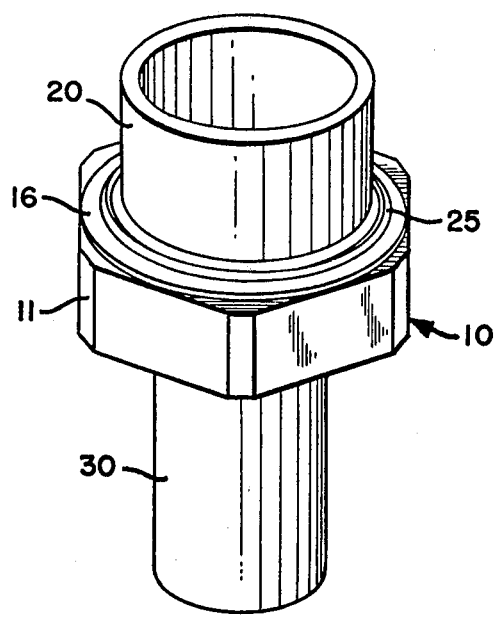
FIG. 1 is a perspective view of a mount made in accordance with the present invention.
Figure 2:
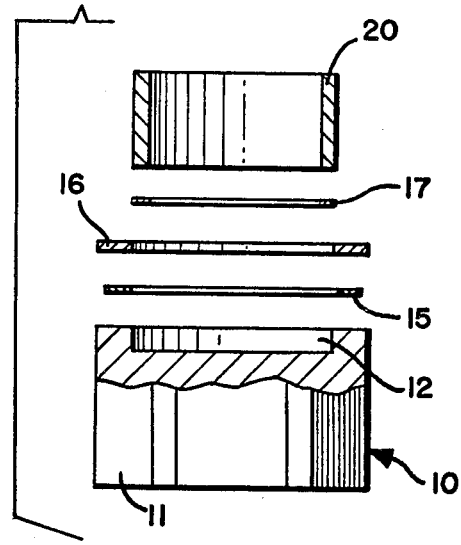
FIG. 2 is an exploded view partly in section and partly in elevation showing the component parts which are assembled to form the finished mount.

Referring now to the drawings which illustrate two preferred embodiments of the invention, the blank is shown generally at 10 comprising a hexagonal shape and body 11 with a shallow central recess 12. A silver braze ring 15 is received on the peripheral edge around the recess 12, and a steel weld ring 16 is positioned on top of that. A further braze ring 17 is placed in recess 12 and a steel tube 20 is assembled on top of that.

Figure 3:
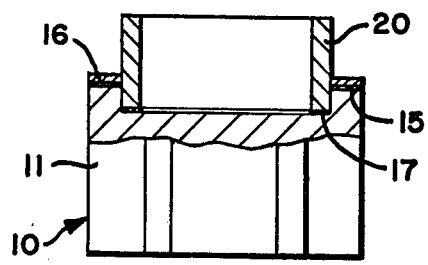
FIG. 3 is a similar view following the brazing operation in which a recess in the upper surface of the blank is used to properly locate the steel tube.

The next operation is to apply heat to cause the brazing of the steel ring 16 on the top of pedestal 10 with the steel tube 20 likewise brazed and fixed in position within ring 16 and seated in the recess 12 as shown in FIG. 3.

It will be clear that the steel tube is precisely located within recess 12 which engages the outer diameter of the tube and maintains the tube in alignment with the copper billet during the brazing operation. As a result of this operation the steel tube 20 and ring 16 are permanently and intimately bonded in proper position upon the upper face of billet 10.

In the next operation a cold-working step is performed by the application of pressure to the billet 10 with the extrusion of the metal to form a deeper recess 12a and to produce a raised rib 25 on the upper face of ring 16. This cold-working step produces a cold-hardening of the copper material and of the steel ring and tube which to some extent had been annealed during the brazing operation.

Figure 5:
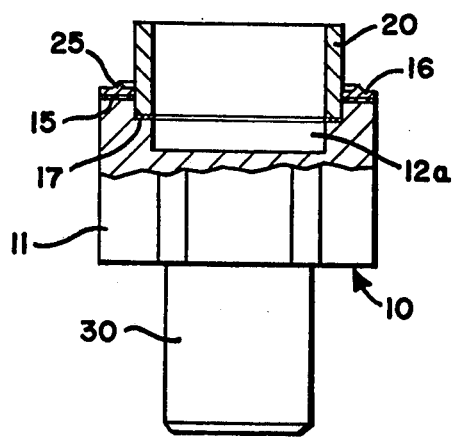
FIG. 5 is a similar view of the finished mount following the second extrusion step in which the downwardly projecting stem has been produced.

FIG. 5 shows the result of the further cold-working step which results in the extrusion of the blank to produce a downwardly extending stem 30 and to complete the formation of rib 25. This second cold-working step thus further causes work-hardening of all components so treated and produces the final product having the characteristics desired for a semi-conductor mount.

Figure 4:
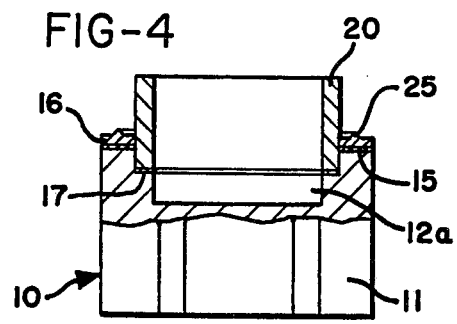
FIG. 4 is a similar view after a first cold-working step has been performed showing the formation of a deeper recess and the initial forming of the steel ring.
Figure 6:
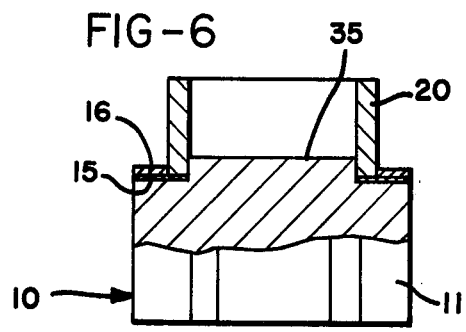
FIG. 6 shows a different form of blank in which a pedestal is used in place of a recess in order to obtain the proper predetermined positioning of the steel tube.

Referring now to FIG. 6, this figure corresponds approximately to FIGS. 3 and 4 above except that instead of having the billet 10 formed with a recess 12, it is now formed with a central pedestal 35 and the steel ring 16 and tube 20 are thereby located in predetermined position in relation to the inside diameter of tube 20. The remaining steps, i.e., the cold-working of this assembly are performed in essentially the same manner as described above with relation to FIGS. 4 and 5. If desired the pedestal 35 may be retained or the metal extruded so that there is neither a pedestal nor a recess in the finished part. Further, if desired the extrusion may be carried out to perform a recess in the upper surface so that the finished product will be in all respects in the same shape as described with respect to FIG. 5.

The invention thus discloses a finished semi-conductor mount which is produced through the initial working of a preformed hexagonally shaped copper mount by multiple cold-working operations to produce the desired configuration following the brazing of a steel ring and tube in predetermined position thereon and with the resulting work-hardening of the material of all the components following the brazing treatment.

While the methods herein described constitute preferred embodiments of the invention, it is to be understood that the invention is not limited to these precise methods, and that changes may be made therein without departing from the scope of the invention.

What is claimed is:

1. The method of forming a mount for a solid state rectifier and the like which comprises
   a. forming a hexagonal shaped billet of high conductivity copper,
   b. brazing a steel ring on the upper surface of said billet,
   c. brazing a steel tube in position within said ring on the upper surface of said billet,
   d. cold-forming said billet in a first extrusion step to provide a recess in the upper face of said billet of the same diameter as the inner diameter of said tube and concurrently generating a weld-projection on the upper surface of said ring,
   e. and additionally cold-forming said billet in a second extrusion step to form a downwardly projecting stem thereon (and to additionally shape said weld projection), said first and second extrusion steps causing work-hardening of said brazed joints and of the copper of said billet.

2. The method of claim 1 in which the forming of the billet includes the forming of a recess on the upper surface of the billet, and using the recess to accurately locate the steel tube in proper position.

3. The method of claim 1 in which the forming of the billet includes forming a central pedestal, and using the pedestal to accurately locate the steel tube in proper position.

* * * * *